(12) United States Patent
Yanagida

(10) Patent No.: US 6,977,804 B2
(45) Date of Patent: Dec. 20, 2005

(54) ELECTROSTATIC CHUCK SUPPORT MECHANISM, SUPPORT STAND DEVICE AND PLASMA PROCESSING EQUIPMENT

(75) Inventor: Hisashi Yanagida, Kobe (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 271 days.

(21) Appl. No.: 10/650,916

(22) Filed: Aug. 29, 2003

(65) Prior Publication Data

US 2004/0120095 A1 Jun. 24, 2004

(30) Foreign Application Priority Data

Aug. 30, 2002 (JP) .............................. 2002-252721

(51) Int. Cl.[7] .......................................... H02N 13/00
(52) U.S. Cl. .................................................... 361/234
(58) Field of Search .......................... 361/234; 279/128

(56) References Cited

U.S. PATENT DOCUMENTS

| | | | |
|---|---|---|---|
| 5,250,137 A | 10/1993 | Arami et al. ............... 156/345 |
| 5,348,497 A * | 9/1994 | Nitescu ....................... 439/824 |
| 5,625,526 A | 4/1997 | Watanabe et al. ........... 361/234 |
| 5,753,132 A | 5/1998 | Shamouilian et al. ....... 156/345 |
| 5,801,915 A * | 9/1998 | Kholodenko et al. ....... 361/234 |
| 6,072,685 A | 6/2000 | Herchen ...................... 361/234 |
| 6,159,055 A | 12/2000 | Satitpunwaycha et al. .. 439/700 |
| 6,219,219 B1 * | 4/2001 | Hausmann et al. ......... 361/234 |
| 2002/0180466 A1 * | 12/2002 | Hiramatsu et al. .......... 324/719 |

* cited by examiner

*Primary Examiner*—Ronald Leja
(74) *Attorney, Agent, or Firm*—Birch, Stewart, Kolasch & Birch, LLP

(57) ABSTRACT

An electrostatic chuck support mechanism is disclosed. An electrostatic chuck plate is fixed to a support stand by hold-down fittings, whereby a plug in a lower end portion of a copper pipe is fitted into a fitting socket against the pushing-up force of a jump-up fitting relying on a compression spring member. When the fixing of the electrostatic chuck plate is released from the support stand, the plug of the copper pipe is pushed up by the pushing-up force of the jump-up fitting relying on the compression spring member to move the copper pipe upward along with the electrostatic chuck plate. The electrostatic chuck support mechanism so constructed enables the electrostatic chuck plate to be mounted and detached easily.

6 Claims, 3 Drawing Sheets

ELECTROSTATIC CHUCK SUPPORT MECHANISM, SUPPORT STAND DEVICE AND PLASMA PROCESSING EQUIPMENT

The entire disclosure of Japanese Patent Application No. 2002-252721 filed on Aug. 30, 2002, including specification, claims, drawings and summary, is incorporated herein by reference in its entirety.

BACKGROUND OF THE INVENTION

1. Field of the Invention

This invention relates to plasma processing equipment for depositing a film on the surface of a substrate by vapor deposition, a support stand device of the plasma processing equipment, and an electrostatic chuck support mechanism of the support stand device. That is, the invention relates to an electric static chuck fixing structure for enhanced maintainability.

2. Description of the Related Art

Currently, film deposition using a plasma CVD (chemical vapor deposition) system is known for production of a semiconductor. The plasma CVD system is a system in which a source gas for constituting a film is introduced into a film deposition chamber within a container, high frequency waves are shot from a high frequency antenna to convert the source gas into the state of a plasma, and excited active atoms in the plasma promote chemical reactions on the surface of the substrate to carry out film deposition.

In the plasma CVD system, a support stand device for bearing the substrate is provided within the film deposition chamber, and the support stand device is equipped with an electrostatic chuck support mechanism for attracting the substrate electrostatically. The electrostatic chuck support mechanism has an electrostatic chuck plate on which the substrate is directly placed. The electrostatic chuck support mechanism is designed to charge electric ions between the substrate and the electrostatic chuck plate, and apply a bias voltage to draw in negative ions, thereby attracting the substrate to the electrostatic chuck plate uniformly and electrostatically. By attracting the substrate to the electrostatic chuck plate uniformly and intimately, the temperature of the substrate is accurately controlled to the desired temperature.

A conventional electrostatic chuck support mechanism is connected to an electrostatic power source, and has an electrode provided on the electrostatic chuck plate of the support stand device for applying a bias power. The electrode is composed of, for example, a copper pipe member, and has an upper end connected to the electrostatic chuck plate and has a plug provided at its lower end. The plug at the lower end is fitted with a socket leading to a power source (the electrostatic power source, bias power source).

With the conventional electrostatic chuck support mechanism, the electrostatic chuck plate and the connected electrode are detached during maintenance (for example, replacement of the electrostatic chuck plate, a consumable). At this time, the socket is detached from the plug of the electrode, and the electrostatic chuck plate and the electrode integral therewith are pulled out upward. To mount a new electrostatic chuck plate, the electrostatic chuck plate having an electrode integrally connected thereto is mounted from above, and the socket from the power source is fitted to the plug of the electrode.

In pulling out the electrostatic chuck plate upward during maintenance, it is difficult to lift the electrostatic chuck plate because of its own weight. Also, the electrode has been integrally connected to a lower portion of the electrostatic chuck plate, so that the electrostatic chuck plate needs to be pulled out straightly to a certain height. Moreover, a junction between the electrode and the plug has so low a bonding strength that it may be damaged by impact or the like. Thus, an operation for detaching the electrostatic chuck plate has to be performed in a situation where its work efficiency is low.

Furthermore, there is a situation where the socket for the power source is fitted to the plug of the electrode, whereby wiring, etc. are supported. Thus, frequent access to a narrow place below the support stand device is necessary for the operation for fitting the plug and the socket together. Thus, detachment and mounting operations for the electrostatic chuck plate have to be performed in a situation where their work efficiencies are low.

SUMMARY OF THE INVENTION

The present invention has been accomplished in the light of the above-mentioned problems with the earlier technologies. It is a first object of the invention to provide an electrostatic chuck support mechanism capable of easily mounting and detaching an electrostatic chuck plate.

It is a second object of the invention to provide a support stand device equipped with an electrostatic chuck support mechanism capable of easily mounting and detaching an electrostatic chuck plate.

It is a third object of the invention to provide plasma processing equipment having a support stand device equipped with an electrostatic chuck support mechanism capable of easily mounting and detaching an electrostatic chuck plate.

The electrostatic chuck support mechanism of the present invention, for attaining the first object, is an electrostatic chuck support mechanism comprising: an electrostatic chuck plate, mounted on a bearing site of a support stand, for holding a substrate by an electrostatic force; an electrode bar member connected to a lower surface of the electrostatic chuck plate and disposed through a bearing portion; a socket member, fixed beside the support stand, for supplying electricity, a lower portion of the electrode bar member being fitted into the socket member; and a push-up member, provided in the socket member, for pushing the electrode bar member upward, and wherein the electrostatic chuck plate is fixed on the bearing portion, whereby the lower portion of the electrode bar member is fitted into the socket member against a pushing-up force of the push-up member, while fixing of the electrostatic chuck plate from the bearing portion is released, whereby the lower portion of the electrode bar member is pushed upward by the pushing-up force of the push-up member to move the electrode bar member upward along with the electrostatic chuck plate. Thus, the electrostatic chuck support mechanism enables the electrostatic chuck plate to be easily mounted and detached.

In the electrostatic chuck support mechanism, the push-up member may comprise: a jump-up fitting provided slidably within the socket member and having an upper end portion in contact with the lower portion of the electrode bar member; and a compression spring member for urging the jump-up fitting upward. Thus, the electrostatic chuck plate can be pushed up by a simple construction.

In the electrostatic chuck support mechanism, an insulator may be disposed on and fixed to a periphery of each of the electrode bar member and the socket member, and a shield member for shielding against electromagnetic waves may be disposed on and fixed to a periphery of the insulator. Thus, the electrode bar member and the socket member can be prevented from causing discharge and noise.

The support stand device of the present invention, for attaining the second object, is a support stand device provided within a processing chamber in which a plasma is generated to process a surface of a substrate with atoms and molecules excited and activated by the plasma, the support stand device being adapted to hold the substrate, the support stand device further comprising any one of the above-described electrostatic chuck support mechanisms. Thus, a support stand device can be realized which has the electrostatic chuck support mechanism capable of mounting and detaching the electrostatic chuck plate easily.

The plasma processing equipment of the present invention, for attaining the third object, comprises: a processing chamber in which a plasma is generated to process a surface of a substrate with atoms and molecules excited and activated by the plasma; a support stand device, provided in the processing chamber, for holding the substrate; and plasma generation means for generating the plasma within the processing chamber, the plasma processing equipment including any one of the above-described electrostatic chuck support mechanisms as the support stand device. Thus, plasma processing equipment can be realized which has the support stand device equipped with the electrostatic chuck support mechanism capable of mounting and detaching the electrostatic chuck plate easily.

In the plasma processing equipment, the plasma generation means may supply electricity to an antenna to transmit electromagnetic waves and generate a plasma in the processing chamber, thereby depositing a film on the surface of the substrate by means of atoms and molecules excited and activated. Thus, the plasma processing equipment can serve as a plasma film deposition apparatus having the support stand device equipped with the electrostatic chuck support mechanism capable of mounting and detaching the electrostatic chuck plate easily.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

Preferred embodiments of the present invention will now be described in detail with reference to the accompanying drawings, which in no way limit the invention.

Figure 1:
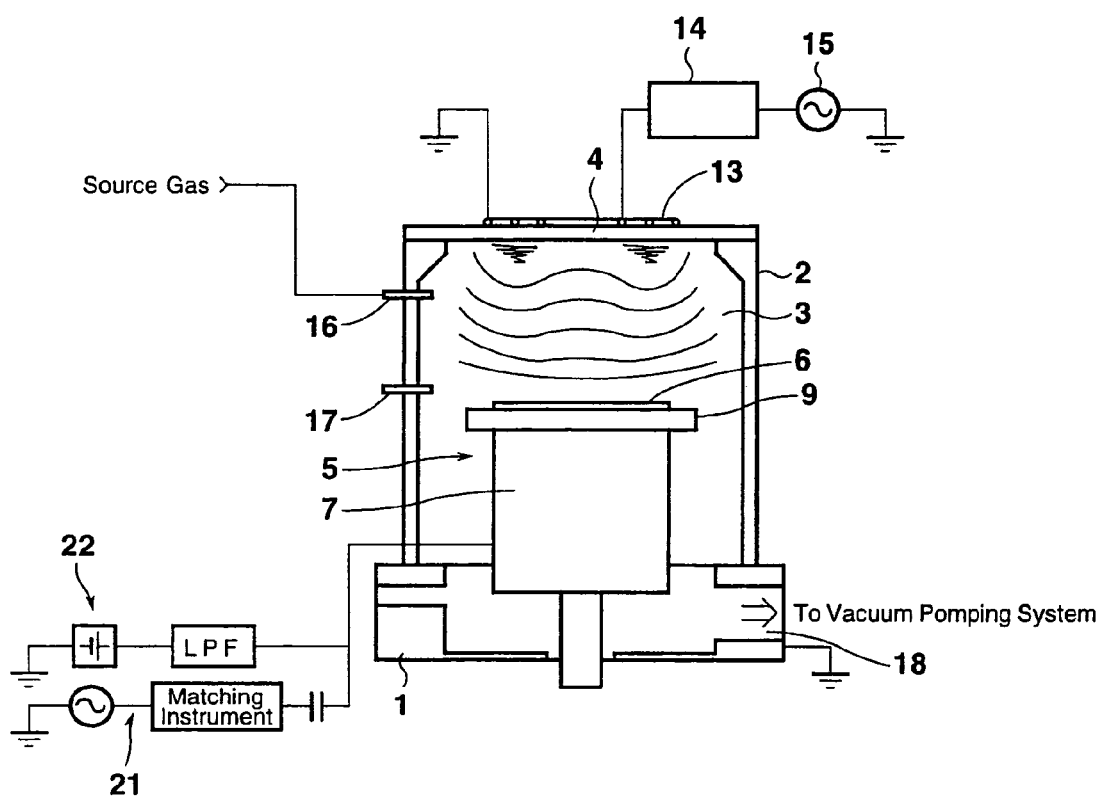
FIG. 1 is a schematic side view of plasma processing equipment (plasma CVD system) according to an embodiment of the present invention.
Figure 2:
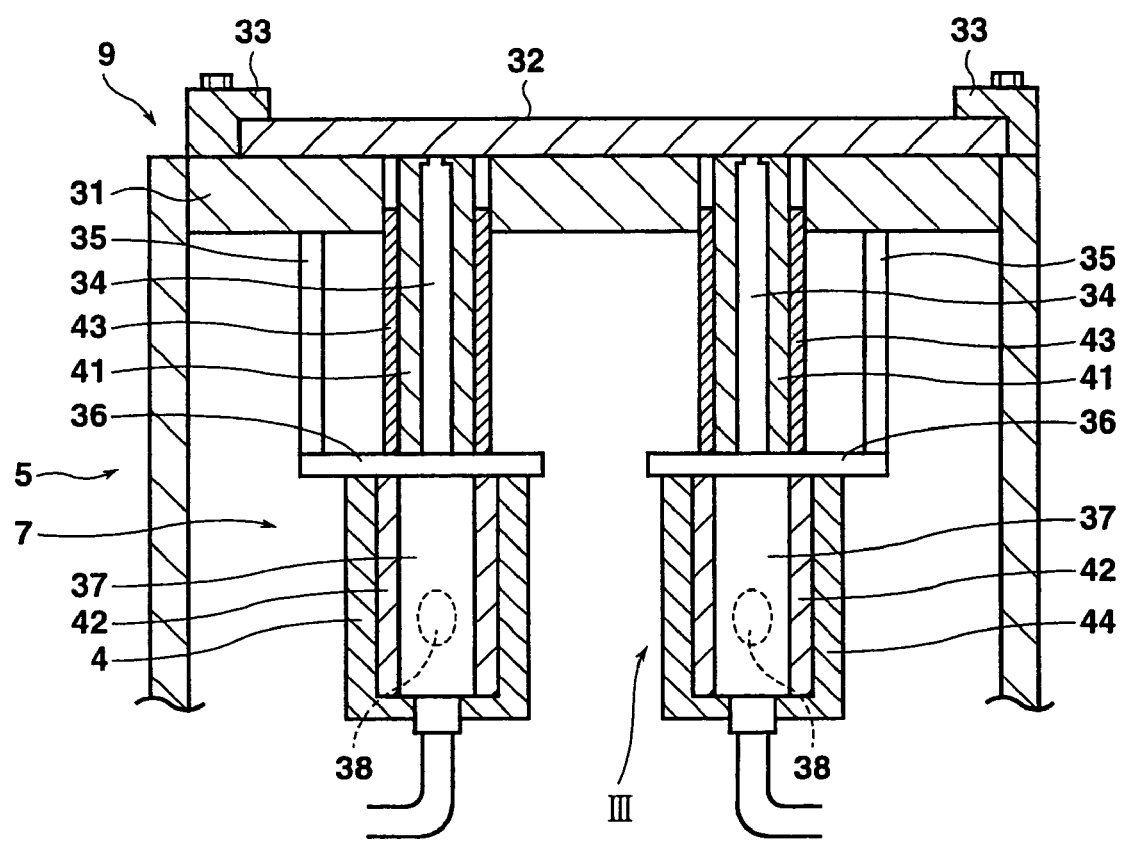
FIG. 2 is a schematic configuration view of a support stand device.
Figure 3:
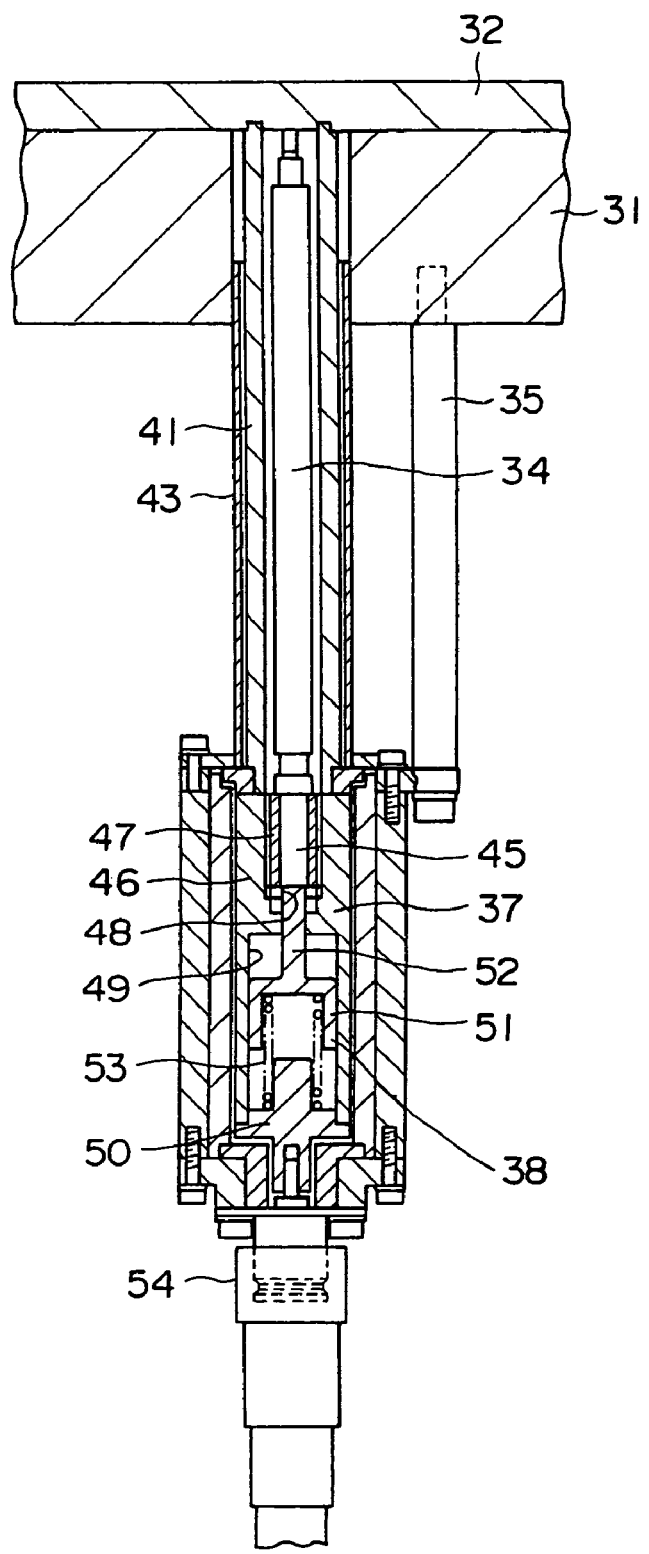
FIG. 3 is a sectional view of an arrowed portion III in FIG. 2 for illustrating an electrostatic chuck support mechanism.

FIG. 1 schematically shows the side of plasma processing equipment (plasma CVD system) according to an embodiment of the present invention. FIG. 2 schematically shows the configuration of a support stand device. FIG. 3 shows the sectional situation of an arrowed portion III in FIG. 2 for illustrating an electrostatic chuck support mechanism.

As shown in FIG. 1, a cylindrical aluminum container 2 is provided on a base 1, and a film deposition chamber 3 is defined within the container 2. A circular ceiling board 4 is provided at the top of the container 2. The film deposition chamber 3 within the container 2 is equipped with a support stand device 5. The support stand device 5 has a bearing portion 9 which electrostatically attracts and holds a substrate 6 of a semiconductor. A holding mechanism 7 equipped with an electrostatic chuck support mechanism is provided below the bearing portion 9.

A bias power source 21 and an electrostatic power source 22 are connected to the holding mechanism 7 of the support stand device 5 to generate a high frequency power in the bearing portion 9 and also produce an electrostatic force therein. The support stand device 5 is adapted to be freely movable upward and downward as a whole, so that its height in the vertical direction can be adjusted to an optimal height.

On the ceiling board 4, a high frequency antenna 13 of, for example, a circular ring shape is disposed. A high frequency power source 15 is connected to the high frequency antenna 13 via a matching instrument 14. By supplying an electric power to the high frequency antenna 13, electromagnetic waves are shot into the film deposition chamber 3 of the container 2. The electromagnetic waves shot into the container 2 ionize gases in the film deposition chamber 3 to generate a plasma.

The container 2 is provided with gas supply nozzles 16 for supplying a source gas such as a silane (for example, $SiH_4$). The source gas, which will become a film forming material (for example, Si), is supplied into the film deposition chamber 3 through the gas supply nozzles 16.

The container 2 is also provided with auxiliary gas supply nozzles 17 for supplying an auxiliary gas such as an inert gas (rare gas), e.g. argon or helium, or oxygen or hydrogen. An exhaust port 18, which is connected to a vacuum pumping system (not shown) for evacuating the interior of the container 2, is provided in the base 1. Also, a carry-in/carry-out port for the substrate 6 is provided in the container 2, although this port is not shown. Through this port, the substrate 6 is carried from a transport chamber (not shown) into the container 2 and carried out of the container 2 to the transport chamber.

In the above-described plasma CVD system, the substrate 6 is placed on the bearing portion 9 of the support stand device 5, and electrostatically attracted thereto. The source gas at a predetermined flow rate is supplied through the gas supply nozzles 16 into the film deposition chamber 3, while the auxiliary gas at a predetermined flow rate is supplied through the auxiliary gas supply nozzles 17 into the film deposition chamber 3. The interior of the film deposition chamber 3 is set at a predetermined pressure adapted to the film deposition conditions.

Then, the electric power is supplied from the high frequency power source 15 to the high frequency antenna 13 to generate high frequency electromagnetic waves. At the same time, the electric power is supplied from the bias power source 21 to the bearing portion 9 to generate high frequency electromagnetic waves.

By these means, the source gas within the film deposition chamber 3 discharges, and partly comes into a plasma state. This plasma collides with other neutral molecules in the source gas, further ionizing or exciting the neutral molecules. The so formed active particles are adsorbed to the surface of the substrate 6 to cause a chemical reaction with high efficiency, thereby depositing thereon to form a CVD film.

The support stand device 5 equipped with the electrostatic chuck support mechanism in the foregoing plasma CVD system will be described in detail with reference to FIGS. 2 and 3.

As shown in FIG. 2, the bearing portion 9 is constructed by mounting an electrostatic chuck plate 32 onto a bearing site of a support stand 31, and the electrostatic chuck plate 32 is fixed to the support stand 31 by hold-down fittings 33. An upper end portion of a copper pipe 34, as an electrode bar member, is fixed to the lower surface of the electrostatic chuck plate 32.

A plate 36 is fixed to the support stand 31 via a fixing stud 35. A socket 37, as a socket member to be connected to the bias power source 21 and the electrostatic power source 22, is fixed to the plate 36. A lower end portion of the copper pipe 34 (i.e., a lower portion of the electrode bar member; the lower end portion of the copper pipe 34 or the lower portion of the electrode bar member will be referred to later as a plug) is fitted into the socket 37.

The socket 37 is provided with a push-up member 38. The copper pipe 34 is inserted into the support stand 31, the electrostatic chuck plate 32 is placed on the bearing portion 9, and the electrostatic chuck plate 32 is fixed to the bearing portion 9 by means of the hold-down fittings 33. By so doing, the lower end portion (plug) of the copper pipe 34 is fitted into the socket 37 against the pushing-up force of the push-up member 38.

The hold-down fittings 33 are detached to release the electrostatic chuck plate 32 from the support stand 31, whereupon the lower end portion (plug) of the copper pipe 34 is pushed upward by the pushing-up force of the push-up member 38. As a result, the copper pipe 34 moves upward to lift the electrostatic chuck plate 32 from the support stand 31.

As shown in FIGS. 2 and 3, a ceramic insulation pipe 41 covering an outer peripheral portion of the copper pipe 34 is fixed to an upper portion of the plate 36. A ceramic insulation pipe 42 covering an outer peripheral portion of the socket 37 is fixed to a lower portion of the plate 36. A shield pipe 43 for shielding against electromagnetic waves is provided on the outer periphery of the insulation pipe 41, and a support pipe 44 for supporting the socket 37 on the plate 36 is provided on the outer periphery of the insulation pipe 42.

The constitutions of the plug, the socket 37 and the push-up member 38 will be described based on FIG. 3.

As shown in the drawing, the copper pipe 34 is hollow, and has a plug 45 screwed to, and brazed to, its lower end. The socket 37 has a sleeve 46 fixed to the inner periphery of the insulation pipe 42 by, for example, welding. A fitting socket 47 is attached to an upper side of the sleeve 46 by, for example, screwing, and a through-hole 48 is formed at the lower end of the fitting socket 47.

An inner cylinder 49 is formed on a lower side of the sleeve 46, and a cover member 50 is fixed to a lower opening of the inner cylinder 49. A jump-up fitting 51 is provided within the inner cylinder 49 so as to be slidable upward and downward. The jump-up fitting 51 is provided with a shaft portion 52 which slides through the through-hole 48. An upper end surface of the shaft portion 52 is in contact with a lower end surface of the plug 45.

A compression spring member 53 is provided between the cover member 50 and the jump-up fitting 51, and the jump-up fitting 51 is urged upward by the compression spring member 52. Wiring (not shown) for the bias power source 21 and the electrostatic power source 22 is connected to the lower end of the socket 37 by a connector 54.

The actions of the support stand device 5 equipped with the electrostatic chuck support mechanism will be described.

The socket 37 is fixed on the side of the support stand 31, and the wiring for the bias power source 21 and the electrostatic power source 22 is connected to the socket 37 by the connector 54. When the copper pipe 34 is inserted into the support stand 31 of the bearing portion 9 and the electrostatic chuck plate 32 is placed on the bearing portion, the copper pipe 34 is inserted within the insulation pipe 41 fixed to the support stand 31.

Upon insertion of the copper pipe 34, the plug 45 is fitted into the fitting socket 47, and the lower end surface of the plug 45 contacts the shaft portion 52 of the jump-up fitting 51. When, in this condition, the electrostatic chuck plate 32 is pressed against, and fixed to, the support stand 31 by the hold-down fittings 33, the jump-up fitting 51 is pushed downward by the plug 45 against the urging force of the compression spring member 53.

According to this procedure, the electrostatic chuck plate 32 is fixed in a predetermined state to the support stand 31. Then, the substrate 6 is detachably mounted, and film deposition is performed.

To detach the electrostatic chuck plate 32 for purposes of maintenance (e.g., replacement of the electrostatic chuck plate 32), the hold-down fittings 33 are removed to release the fixing of the electrostatic chuck plate 32 onto the support stand 31. By releasing the fixing of the electrostatic chuck plate 32, the jump-up fitting 51 pushes the plug 45 upward under the urging force of the compression spring member 53, whereby the copper pipe 34 moves upward together with the electrostatic chuck plate 32. In this state, the electrostatic chuck plate 32 having the copper pipe 34 fixed thereto is pulled out above the support stand 31, and a predetermined operation such as replacement is carried out.

In removing the electrostatic chuck plate 32, therefore, mere release of the fixing of the electrostatic chuck plate 32 to the support stand 31 enables the electrostatic chuck plate 32 to be moved upward by the urging force of the compression spring member 53, and thus be removed very easily. In mounting the electrostatic chuck plate 32, it suffices to set in place the electrostatic chuck plate 32 having the copper pipe 34 fixed thereto while inserting the copper pipe 34 into the support stand 31. As a result, the plug 45 is fitted into the fitting socket 47, thus making connection to the power source possible.

Thus, the mounting and detachment of the electrostatic chuck plate 32, and the connection of the copper pipe 34 to the power source become extremely easy, and the replaceability of the electrostatic chuck plate 32 is markedly improved.

Furthermore, the socket 37 is fixed to the support stand 31, so that the connector 54 from the power source side is supported by the support stand 31. This obviates the necessity for performing operations for connecting the connector 54 on the power source side to the copper pipe 34 as the electrode, and disconnecting the connector 54 from the copper pipe 34. Thus, the burden of operations in the narrow place below the support stand 31 can be lessened.

Besides, the copper pipe 34 and the socket 37 can be covered with the insulation pipes 42, 42 and the shield pipe 43, whereby discharge and noise can be prevented. According to customary practice, in which the connector 54 on the power source side is connected to the copper pipe 34 as the electrode, the site of the socket is integral with a flexible cord, thus making the provision of the shield pipe, etc.

difficult. In the aforementioned embodiment, the socket 37 is fixed to the support stand 31, thus facilitating shielding of the socket 37.

In addition, a very simple configuration is contemplated in which the jump-up fitting 51 is pushed up by the urging force of the compression spring member 53. However, a configuration in which the jump-up fitting 51 is pushed up with satisfactory controllability by use of an actuator (e.g. pneumatic, electric) can be adopted.

Hence, according to the present invention, the electrostatic chuck support mechanism is achievable which can easily perform mounting and detachment of the electrostatic chuck plate 32. Also achievable is the support stand device 5 equipped with the electrostatic chuck support mechanism which can easily perform mounting and detachment of the electrostatic chuck plate 32. Further achievable is the plasma processing equipment having the support stand device 5 which can easily perform mounting and detachment of the electrostatic chuck plate 32.

While the present invention has been described in the foregoing fashion, it is to be understood that the invention is not limited thereby, but may be varied in many other ways. Such variations are not to be regarded as a departure from the spirit and scope of the invention, and all such modifications as would be obvious to one skilled in the art are intended to be included within the scope of the appended claims.

What is claimed is:

1. An electrostatic chuck support mechanism comprising:
   an electrostatic chuck plate, mounted on a bearing site of a support stand, for holding a substrate by an electrostatic force;
   an electrode bar member connected to a lower surface of said electrostatic chuck plate and disposed through a bearing portion;
   a socket member, fixed beside said support stand, for supplying electricity, a lower portion of said electrode bar member being fitted into said socket member; and
   a push-up member, provided in said socket member, for pushing said electrode bar member upward, and wherein
   said electrostatic chuck plate is fixed on said bearing portion, whereby the lower portion of said electrode bar member is fitted into said socket member against a pushing-up force of said push-up member, while fixing of said electrostatic chuck plate from said bearing portion is released, whereby the lower portion of said electrode bar member is pushed upward by the pushing-up force of said push-up member to move said electrode bar member upward along with said electrostatic chuck plate.

2. The electrostatic chuck support mechanism according to claim 1, wherein
   said push-up member comprises:
   a jump-up fitting provided slidably within said socket member and having an upper end portion in contact with the lower portion of said electrode bar member; and
   a compression spring member for urging said jump-up fitting upward.

3. The electrostatic chuck support mechanism according to claim 1 or 2, wherein
   an insulator is disposed on and fixed to a periphery of each of said electrode bar member and said socket member, and
   a shield member for shielding against electromagnetic waves is disposed on and fixed to a periphery of said insulator.

4. A support stand device provided within a processing chamber in which a plasma is generated to process a surface of a substrate with atoms and molecules excited and activated by the plasma, said support stand device being adapted to hold the substrate,
   said support stand device further comprising the electrostatic chuck support mechanism according to claim 1.

5. Plasma processing equipment comprising:
   a processing chamber in which a plasma is generated to process a surface of a substrate with atoms and molecules excited and activated by the plasma;
   a support stand device, provided in said processing chamber, for holding the substrate; and
   plasma generation means for generating the plasma within said processing chamber,
   said plasma processing equipment including the electrostatic chuck support mechanism according to claim 1 as said support stand device.

6. The plasma processing equipment according to claim 5, wherein
   said plasma generation means supplies electricity to an antenna to transmit electromagnetic waves and generate a plasma in said processing chamber, thereby depositing a film on the surface of the substrate by means of atoms and molecules excited and activated.

* * * * *